United States Patent
Chakkirala et al.

(10) Patent No.: US 10,944,385 B1
(45) Date of Patent: Mar. 9, 2021

(54) DELAY CIRCUIT THAT ACCURATELY MAINTAINS INPUT DUTY CYCLE

(71) Applicant: QUALCOMM Incorporated, San Diego, CA (US)

(72) Inventors: Subbarao Surendra Chakkirala, San Jose, CA (US); Sherif Galal, Irvine, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/894,534

(22) Filed: Jun. 5, 2020

Related U.S. Application Data

(60) Provisional application No. 62/962,606, filed on Jan. 17, 2020.

(51) Int. Cl.
| | |
|---|---|
| H03K 5/13 | (2014.01) |
| H03K 5/00 | (2006.01) |
| H03K 19/20 | (2006.01) |
| H03K 3/037 | (2006.01) |
| G06F 1/08 | (2006.01) |
| H03F 3/217 | (2006.01) |

(52) U.S. Cl.
CPC ................ H03K 5/00 (2013.01); G06F 1/08 (2013.01); H03F 3/217 (2013.01); H03K 3/037 (2013.01); H03K 19/20 (2013.01); H03K 2005/00078 (2013.01)

(58) Field of Classification Search
CPC .......... H03K 2005/00013; H03K 2005/00078; H03K 2005/00104; H03K 5/13; H03K 5/131; H03K 5/134; H03K 5/135; H03K 5/15; H03K 5/15006; H03K 5/1515; G06F 1/022; G06F 1/04; G06F 1/08; G06F 1/10
See application file for complete search history.

(56) References Cited

U.S. PATENT DOCUMENTS

| | | | |
|---|---|---|---|
| 6,060,920 A | 5/2000 | Saeki | |
| 6,194,937 B1 | 2/2001 | Minami | |
| 6,236,245 B1 * | 5/2001 | Papaliolios | ........ H03K 19/0013 326/82 |
| 6,285,229 B1 * | 9/2001 | Chu | ........................ H03K 5/131 327/277 |
| 7,135,906 B2 | 11/2006 | Takai et al. | |
| 7,532,051 B2 * | 5/2009 | Uladzimir | ............. G06F 1/3203 327/161 |
| 7,548,127 B2 * | 6/2009 | Morini | ................. H03K 3/0315 331/177 R |

(Continued)

*Primary Examiner* — An T Luu
(74) *Attorney, Agent, or Firm* — Loza & Loza LLP

(57) ABSTRACT

In certain aspects, a delay circuit includes a multiplexer, a first delay path coupled between an input of the delay circuit and a first input of the multiplexer, and a second delay path coupled between the input of the delay circuit and a second input of the multiplexer. The first delay path includes a first delay device, and the second delay path includes a first inverter, a second delay device, and a second inverter. In other aspects, a delay circuit includes a latch including a first input, a second input, and an output. The first input of the latch is coupled to an input of the delay circuit. The delay circuit also includes a delay path coupled between the input of the delay circuit and the second input of the latch, wherein the delay path includes a pulse generator and a delay device.

30 Claims, 13 Drawing Sheets

(56) References Cited

U.S. PATENT DOCUMENTS

| | | | |
|---|---|---|---|
| 7,714,632 B2 * | 5/2010 | Cho | ............... H03K 5/1515 |
| | | | 327/291 |
| 7,733,147 B2 | 6/2010 | Lee et al. | |
| 8,601,427 B2 | 12/2013 | Kawagoe | |

* cited by examiner

DELAY CIRCUIT THAT ACCURATELY MAINTAINS INPUT DUTY CYCLE

RELATED APPLICATION

This application claims priority under 35 U.S.C. § 119(e) to U.S. Provisional Application No. 62/962,606 filed on Jan. 17, 2020, the entire specification of which is incorporated herein by reference.

BACKGROUND

Field

Aspects of the present disclosure relate generally to delay circuits.

Background

A delay circuit is a circuit that delays an input signal by a time delay. Delay circuits may be used in a variety of applications. For example, a delay circuit may be used to delay a clock signal that is sent to a circuit to time operations of the circuit.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to a chip including a delay circuit. The delay circuit includes a multiplexer including a first input, a second input, and an output. The delay circuit also includes a first delay path coupled between an input of the delay circuit and the first input of the multiplexer, the first delay path including a first delay device. The delay circuit also includes a second delay path coupled between the input of the delay circuit and the second input of the multiplexer. The second delay path includes a first inverter, a second delay device, and a second inverter.

A second aspect relates to a method for delaying an input signal. The method includes delaying the input signal to obtain a first delayed signal, and passing an edge of the first delayed signal to a delay output. The method also includes inverting the input signal to obtain an inverted signal, delaying the inverted signal to obtain a delayed inverted signal, inverting the delayed inverted signal to obtain a second delayed signal, and passing an edge of the second delayed signal to the delay output.

A third aspect relates to a chip including a delay circuit. The delay circuit includes a latch including a first input, a second input, and an output, wherein the first input is coupled to an input of the delay circuit. The delay circuit also includes a delay path coupled between the input of the delay circuit and the second input of the latch. The delay path includes a pulse generator including an input and an output, wherein the input of the pulse generator is coupled to the input of the delay circuit, and the pulse generator is configured to generate a first pulse in response to a rising edge at the input of the pulse generator, and generate a second pulse in response to a falling edge at the input of the pulse generator. The delay path also includes a delay device coupled between the output of the pulse generator and the second input of the latch.

A fourth aspect relates to a method for delaying an input signal. The method includes generating a first pulse in response to a rising edge of the input signal, delaying the first pulse to obtain a first delayed pulse, and latching a first logic value of the input signal in response to an edge of the first delayed pulse. The method also includes generating a second pulse in response to a falling edge of the input signal, delaying the second pulse to obtain a second delayed pulse, and latching a second logic value of the input signal in response to an edge of the second delayed pulse.

A fifth aspect relates to an apparatus. The apparatus includes a means for selectively coupling a first input or a second input to an output. The apparatus also includes a first delay path coupled between an input of the apparatus and the first input, the first delay path including a first means for delaying. The apparatus also includes a second delay path coupled between the input of the delay circuit and the second input. The second delay path includes a first means for inverting, a second means for delaying, and a second means for inverting.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the described implementations are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1A:
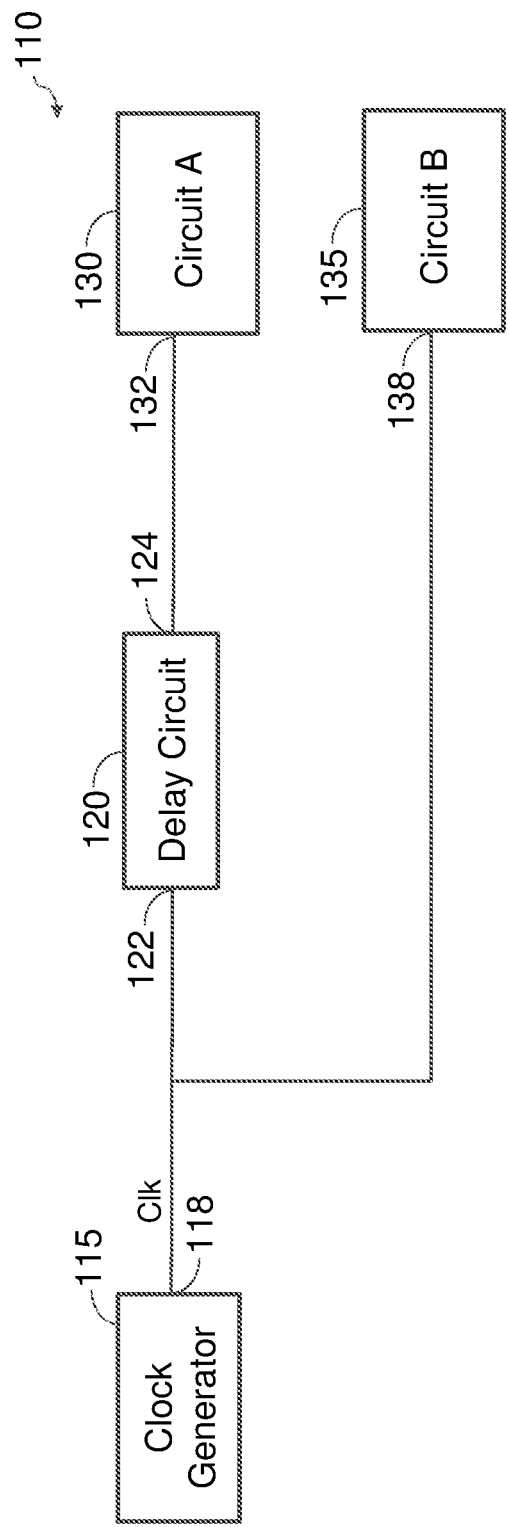
FIG. 1A shows an example of a system including a delay circuit according to certain aspects of the present disclosure.

FIG. 1A shows an example of a system 110 including a clock generator 115, a first circuit 130 (labeled "Circuit A"), a second circuit 135 (labeled "Circuit B"), and a delay circuit 120. The system 110 may be integrated on a chip (e.g., a system on a chip), and the clock generator 115 may be implemented with a phase locked loop (PLL) or another type of clock generator. In this example, the clock generator 115 generates a clock signal Clk, which is distributed to the first and second circuits 130 and 135 to time operations of the first and second circuits 130 and 135. Although two circuits are shown receiving the clock signal Clk in FIG. 1A, it is to be appreciated that the system 110 may include more than two circuits receiving the clock signal Clk.

The clock generator 115 includes a clock output 118 for outputting the clock signal Clk. The first circuit 130 includes a clock input 132 for receiving the clock signal Clk, and the second circuit 135 includes a clock input 138 for receiving the clock signal Clk. The clock output 118 of the clock generator 115 is coupled to the clock input 132 of the first circuit 130 via the delay circuit 120 and coupled to the clock input 138 of the second circuit 135.

Figure 1B:
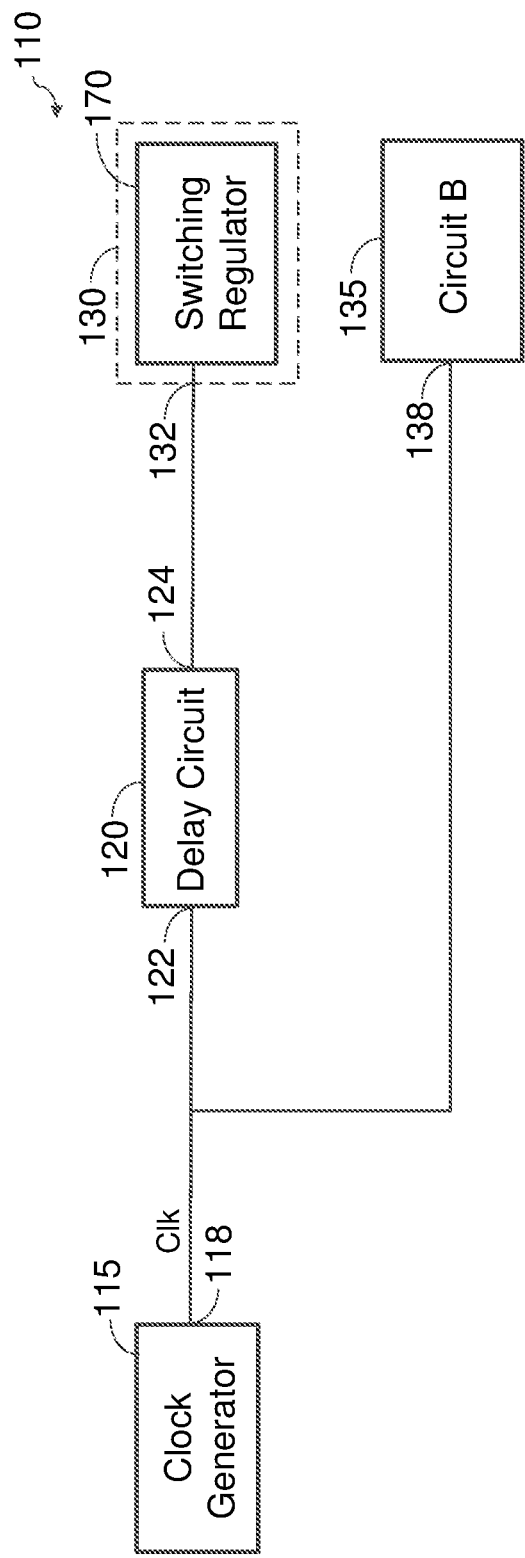
FIG. 1B shows an example of the system including a switching regulator coupled to the delay circuit according to certain aspects of the present disclosure.
Figure 1C:
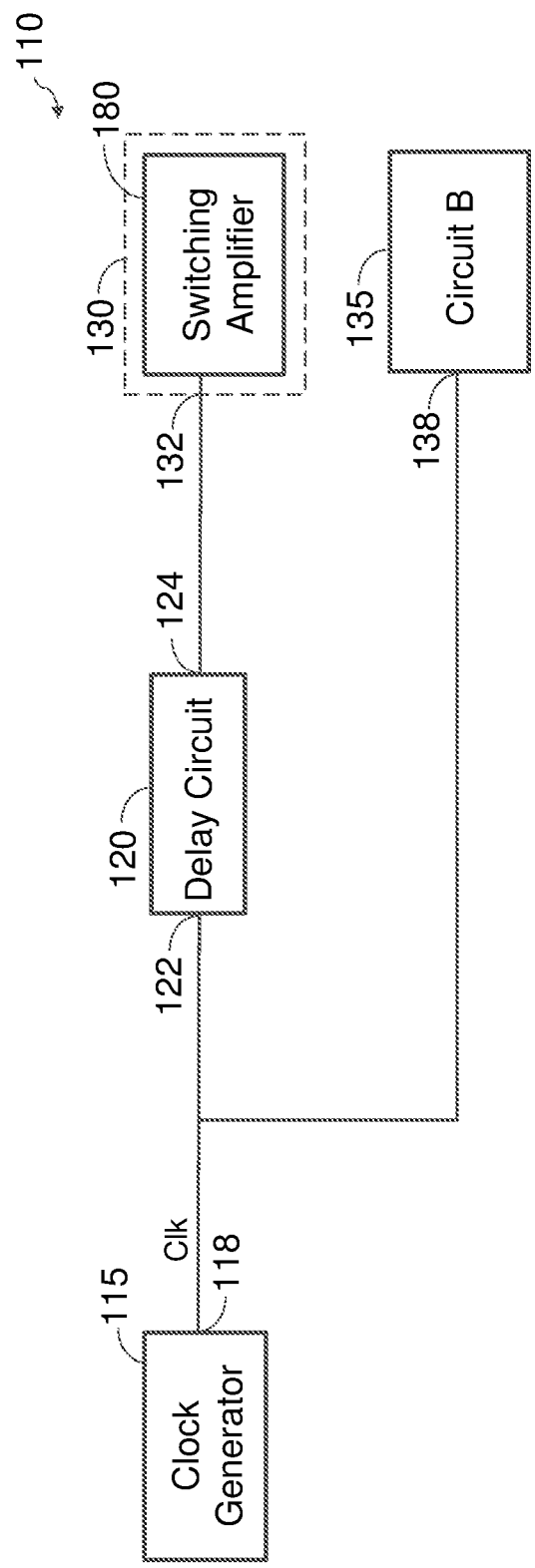
FIG. 1C shows an example of the system including a switching amplifier coupled to the delay circuit according to certain aspects of the present disclosure.

The first circuit 130 may include a circuit that operates on edges of the clock signal Clk such as a switching amplifier (e.g., class-D driver), a switching regulator (e.g., a boost converter, a buck converter, etc.) and/or another type of circuit. FIG. 1B shows an example in which the first circuit 130 includes a switching regulator 170 (e.g., a boost converter, a buck converter, etc.). FIG. 1C shows an example in which the first circuit 130 includes a switching amplifier 180 (e.g., class-D driver). The second circuit 135 may also include a circuit that operates on edges of the clock signal Clk. A challenge with using a circuit that operates on clock edges is that such a circuit may generate a large amount of supply/ground disturbance due to switching in the circuit on the clock edges, which can negatively impact the operation of another circuit (e.g., another circuit coupled to the same supply rail and/or ground rail as the circuit).

To address the above problem, the clock signal Clk may be skewed between the first circuit 130 and the second circuit 135 to reduce the effect that supply/ground disturbance caused by one of the circuits (e.g., the first circuit 130) has on the operation of the other circuit (e.g., the second circuit 135). The clock skew may be achieved using one or more delay circuits.

In this regard, FIG. 1A shows an example in which the delay circuit 120 delays the clock signal Clk received by the first circuit 130 in order to skew the clock signal Clk between the first circuit 130 and the second circuit 135. The delay circuit 120 includes an input 122 coupled to the clock output 118 of the clock generator 115, and an output 124 coupled to the clock input 132 of the first circuit 130. The delay circuit 120 receives the clock signal Clk at the input 122, delays the clock signal Clk by a time delay, and outputs the delayed clock signal at the output 124. The time delay of the delay circuit 120 may be set to a time delay that provides a desired clock skew between the first circuit 130 and the second circuit 135 (e.g., a clock skew that minimizes the effect that supply/ground disturbance caused by one of the circuits (e.g., the first circuit 130) has on the operation of the other circuit (e.g., the second circuit 135)). Although one delay circuit 120 is shown in the example in FIG. 1A, it is to be appreciated that the system 110 may include one or more additional delay circuits.

A delay circuit may have different delays for rising and falling edges across process-voltage-temperature (PVT) variations. The different delays for rising and falling edges alters (i.e., distorts) the duty cycle of a clock signal being delayed by the delay circuit, resulting in the delayed clock signal having a different duty cycle than the input clock signal. The duty cycle distortion may have a severe effect on the performance of a circuit receiving the delayed clock signal. For example, if a class-D driver does not receive a clock signal with a 50% duty cycle due to duty cycle distortion caused by the delay circuit, then one side of the driver's output may clip earlier than the other side of the driver's output which limits the maximum clean power that can be delivered to a load (e.g., a speaker load). Accordingly, a delay circuit that accurately maintains an input duty cycle is desirable.

Figure 2:
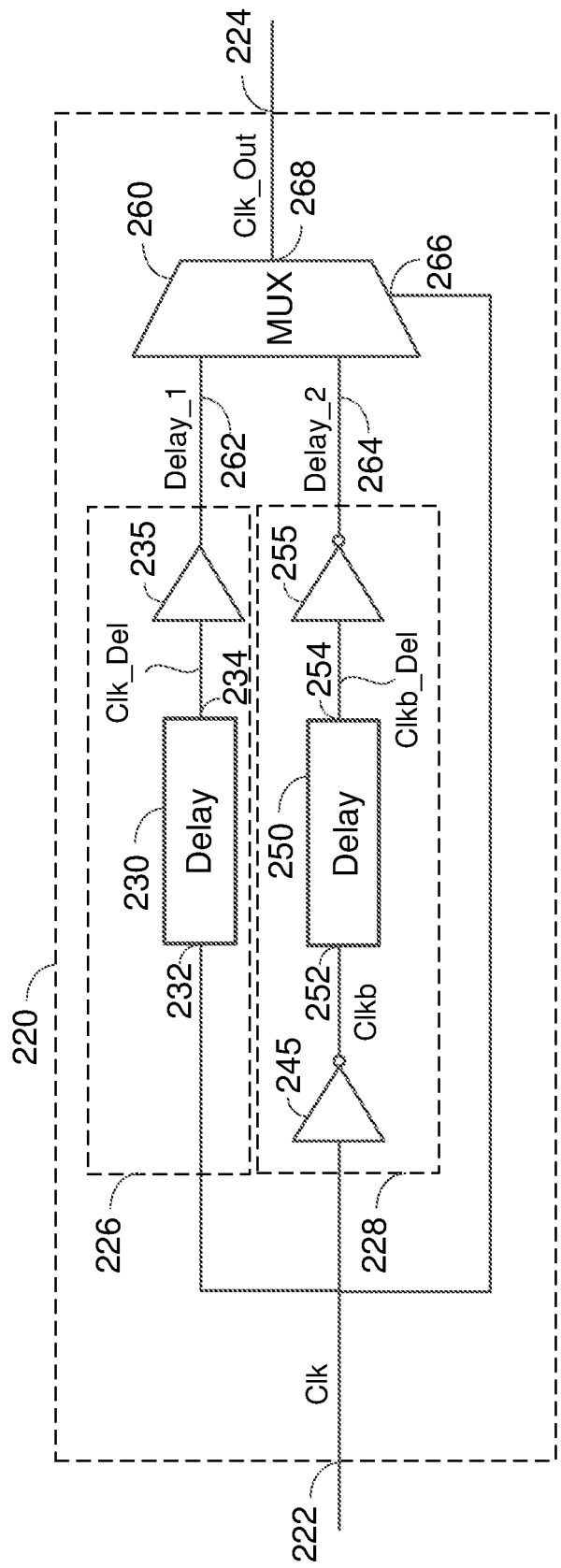
FIG. 2 shows an example of a delay circuit according to certain aspects of the present disclosure.

FIG. 2 shows an exemplary delay circuit 220 according to certain aspects of the present disclosure. The delay circuit 220 may be used to implement the delay circuit 120 shown in FIG. 1. In this example, the delay circuit 220 includes a first delay path 226, a second delay path 228, and a multiplexer 260. The multiplexer 260 includes a first input 262, a second input 264, a select input 266, and an output 268. The first delay path 226 is coupled between the input 222 of the delay circuit 220 and the first input 262 of the multiplexer 260. The second delay path 228 is coupled between the input 222 of the delay circuit 220 and the second input 264 of the multiplexer 260. The output 268 of the multiplexer 260 is coupled to the output 224 of the delay circuit 220. In the example shown in FIG. 2, the select input 266 of the multiplexer 260 is coupled to the input 222 of the delay circuit 220.

The multiplexer 260 is configured to selectively couple the first input 262 or the second input 264 to the output 268 of the multiplexer 260 based on a logic value input to the select input 266 of the multiplexer 260. For example, the multiplexer 260 may be configured to couple the first input 262 to the output 268 of the multiplexer 260 when the logic value input to the select input 266 is one (e.g., high), and couple the second input 264 to the output 268 of the multiplexer 260 when the logic value input to the select input 266 is zero (e.g., low). When the multiplexer 260 couples the first input 262 to the output 268 of the multiplexer 260, the first delay path 226 (which is coupled to the first input 262) is selected, and, when the multiplexer 260 couples to the second input 264 to the output 268 of the multiplexer 260, the second delay path 228 (which is coupled to the second input 264) is selected. Thus, the multiplexer 260 selects the first delay path 226 or the second delay path 228 based on the logic value input to the select input 266. In the example shown in FIG. 2, the select input 266 is coupled to the input 222 of the delay circuit 220. Thus, in this example, the multiplexer 260 selects the first delay path 226 or the second delay path 228 based the on the logic value of the input signal (i.e., the signal input to the delay circuit 220).

In the example shown in FIG. 2, the first delay path 226 includes a first delay device 230 and a delay buffer 235. The first delay device 230 is configured to delay the input signal (e.g., the clock signal Clk) of the delay circuit 220 by a time delay. The first delay device 230 may be implemented with a resistor-capacitor (RC) delay device or another type of delay device. It is to be appreciated that a delay device may also be referred to as a delay element, a delay line, a delay circuit, a buffer, or another term. In the example shown in FIG. 2, the input 232 of the first delay device 230 is coupled to the input 222 of the delay circuit 220, and the delay buffer 235 is coupled between the output 234 of the first delay device 230 and the first input 262 of the multiplexer 260. The purpose of the delay buffer 235 is discussed further below.

The second delay path 228 includes a first inverter 245, a second delay device 250, and a second inverter 255. The first inverter 245 is coupled between the input 222 of the delay circuit 220 and the input 252 of the second delay device 250, and the second inverter 255 is coupled between the output 254 of the second delay device 250 and the second input 264 of the multiplexer 260. In certain aspects, the second delay device 250 has a time delay that is approximately equal to the time delay of the first delay device 230. In this regard, the first delay device 230 and the second delay device 250 may be two separate instances (i.e., copies) of the same delay device, and may be fabricated close to each other on a chip to more closely match the time delay of the first delay device 230 and the time delay of the second delay device 250.

The first inverter 245 is configured to invert the input signal (e.g., the clock signal Clk) before the input signal is input to the second delay device 250, and the second inverter 255 is configured to invert the output signal of the second delay device 250 before the output signal is input to the second input 264 of the multiplexer 260. The delay buffer 235 in the first delay path 226 may have a time delay approximately equal to the combined time delay of the first inverter 245 and the second inverter 255 in the second delay path 228 in order to more closely match the delays in the first delay path 226 and the second delay path 228, as discussed further below.

Exemplary operations of the delay circuit 220 will now be discussed with reference to FIG. 3, which shows a timing diagram illustrating exemplary signals in the delay circuit 220 according to certain aspects. In the example illustrated in FIG. 3, the delay circuit 220 is used to delay the clock signal Clk, although it is to be appreciated that the delay circuit 220 is not limited to delaying a clock signal. In the example in FIG. 3, the multiplexer 260 selects the first delay path 226 when the logic value at the select input 266 is one (e.g., high) and selects the second delay path 228 when the logic value at the select input 266 is zero (e.g., low).

Figure 3:
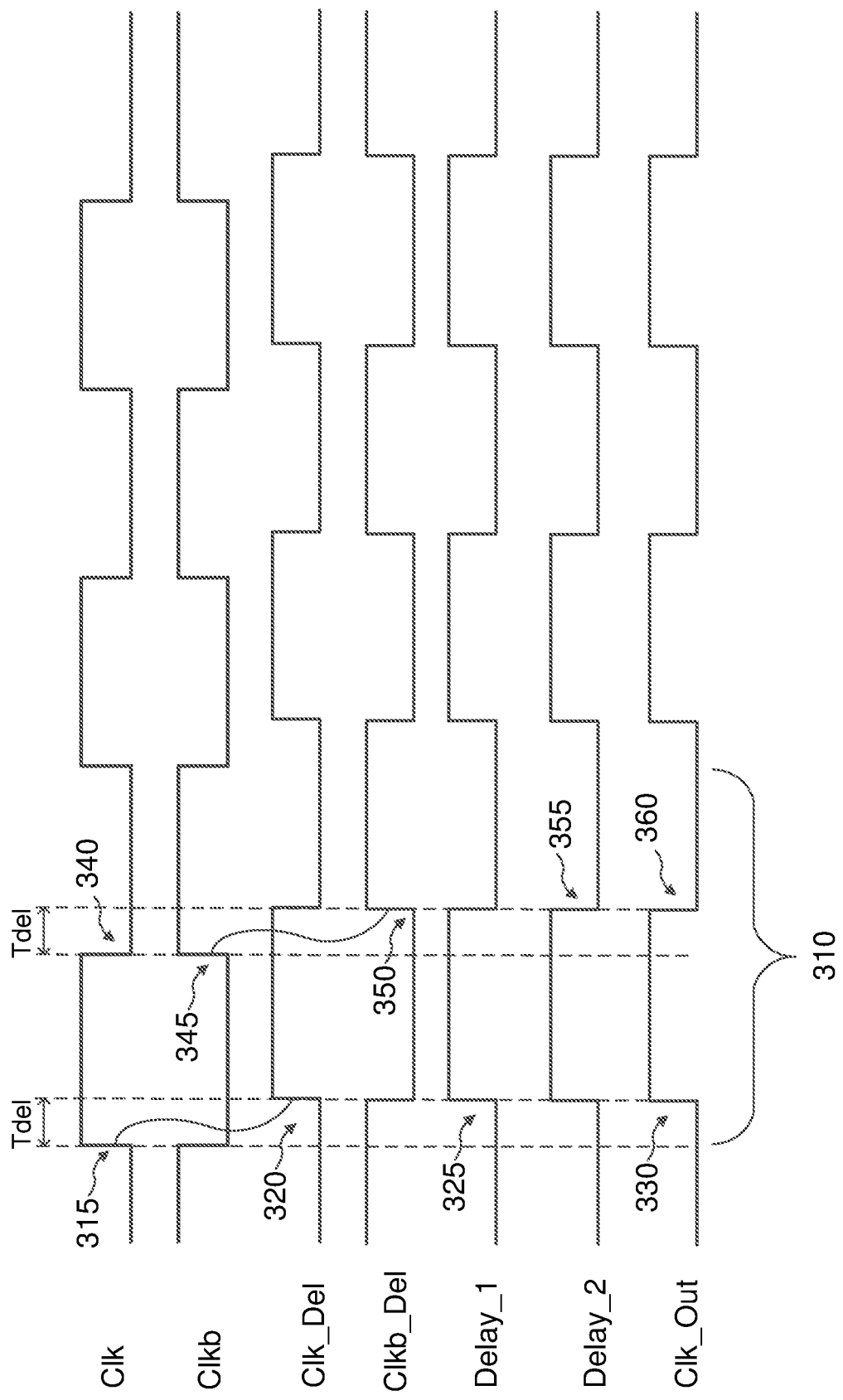
FIG. 3 is a timing diagram showing an example of signals in the delay circuit of FIG. 2 according to certain aspects of the present disclosure.

In the exemplary timing diagram shown in FIG. 3, the time delays associated with the inverters 245 and 255, the delay buffer 235, and the multiplexer 260 are assumed to be negligible compared with the time delays of the first delay device 230 and the second delay device 250, and are therefore not shown in FIG. 3 for ease of discussion. However, it is to be appreciated that this need not be the case.

In FIG. 3, the clock signal Clk is input to the delay circuit 220 at the input 222. The clock signal Clk is delayed by the first delay device 230 in the first delay path 226 to obtain a delayed clock signal Clk_Del. In this example, the delayed clock signal Clk_Del is delayed relative to the input clock signal Clk by a time delay of Tdel. The delayed clock signal Clk_Del is input to the first input 262 of the multiplexer 260 as a first delayed signal Delay_1. In FIG. 3, the first delayed signal Delay_1 is approximately the same as the delayed clock signal Clk_Del, assuming the time delay of the delay buffer 235 is negligible compared with the time delay Tdel.

In FIG. 3, the first inverter 245 in the second delay path 228 inverts the input clock signal Clk to obtain an inverted clock signal Clkb. The inversion converts rising edges of the input clock signal Clk into falling edges and converts falling edges of the input clock signal Clk into rising edges. The second delay device 250 delays the inverted clock signal Clkb by a time delay of Tdel to obtain a delayed inverted clock signal Clkb_Del. In this example, the delay of the first delay device 230 and the delay of the second delay device 250 are approximately the same. The second inverter 255 inverts the delayed inverted clock signal Clkb_Del to obtain a second delayed signal Delay_2, which is input to the second input 264 of the multiplexer 260.

During a cycle 310 of the input clock signal Clk, the multiplexer 260 selects the first delay path 226 when the input clock signal Clk is one (e.g., high). A rising edge 320 of the delayed clock signal Clk_Del occurs during the time that the multiplexer 260 selects the first delay path 226. This causes the multiplexer 260 to pass the corresponding rising edge 325 of the first delayed signal Delay_1 to the output 224 of the delay circuit 220. As a result, the rising edge 325 of the first delayed signal Delay_1 provides a rising edge 330 of the output clock signal Clk_Out. Assuming the delays associated with the delay buffer 235 and the multiplexer 260 are negligible compared with Tdel, the delay between the rising edge 330 of the output clock signal Clk_Out and the rising edge 315 of the input clock signal Clk is approximately Tdel.

During the cycle 310 of the input clock signal Clk, the multiplexer 260 selects the second delay path 228 when the input clock signal Clk is zero (e.g., low). A falling edge 355 of the second delayed signal Delay_2 occurs during the time that the multiplexer 260 selects the second delay path 228. This causes the multiplexer 260 to pass the falling edge 355 of the second delayed signal Delay_2 to the output 224 of the delay circuit 220. As a resulting, the falling edge 355 of the second delayed signal Delay_2 provides a falling edge 360 of the output clock signal Clk_Out. Assuming the delays associated with the inverters 245 and 255 and the multiplexer 260 are negligible compared with Tdel, the delay between the falling edge 360 of the output clock signal Clk_Out and the falling edge 340 of the input clock signal Clk is approximately Tdel.

In the example shown in FIG. 3, the first inverter 245 converts the falling edge 340 of the input clock signal Clk into a rising edge 345 of the inverted clock signal Clkb. The second delay device 250 delays the rising edge 345 of the inverted clock signal Clkb to obtain a rising edge 350 of the delayed inverted clock signal Clkb_Del. The second inverter 255 then converts the rising edge 350 of the delayed inverted clock signal Clkb_Del into the falling edge 355 of the second delayed signal Delay_2, which provides the falling edge 360 of the output clock signal Clk_Out.

The delay circuit 220 may perform the exemplary operations discussed above for each cycle of the input clock signal Clk.

The delay circuit 220 is able to accurately maintain the duty cycle of the input clock signal Clk even when each of the first delay device 230 and the second delay device 250 has different delays for rising and falling edges. This is because the falling edge 340 of the input clock signal Clk is converted into a rising edge 345 by the first inverter 245 before being delayed by the second delay device 250. After the delay by the second delay device 250, the rising edge 350 is converted back into a falling edge 355 by the second inverter 255. As a result, the falling edge 340 of the input clock signal Clk is delayed as a rising edge 345 by the second delay device 250, and therefore undergoes approximately the same delay as the rising edge 315 of the input clock signal Clk in the first delay path 226. This allows the delay circuit 220 to achieve approximately the same delay for the rising edge 315 and the falling edge 340 of the input clock Clk, which significantly reduces duty cycle distortion of the input clock signal Clk caused by the delay circuit 220.

It is to be appreciated that the present disclosure is not limited to the exemplary implementation discussed above in which the multiplexer 260 selects the first input 262 when the logic value at the select input 266 is one (e.g., high) and selects the second input 264 when the logic value at the select input 266 is zero (e.g., low). For example, in some implementations, the multiplexer 260 may be configured to select the first input 262 when the logic value at the select input 266 is zero (e.g., low) and select the second input 264 when the logic value at the select input 266 is one (e.g., high). In this example, during a cycle of the input clock signal Clk, the second delay path 228 is used to delay the rising edge of the input clock signal Clk, and the first delay path 226 is used to delay the falling edge of the input clock signal Clk. In the second delay path 228, the rising edge of the input clock signal Clk is converted into a falling edge by the first inverter 245 before being delayed by the second delay device 250. After the delay by the second delay device 250, the falling edge is converted back into a rising edge by the second inverter 255. As a result, the rising edge of the input clock signal Clk is delayed as a falling edge by the second delay device 250, and therefore undergo approximately the same delay as the falling edge of the input clock signal Clk in the first delay path 226. This allows the delay circuit 220 to achieve approximately the same delay for the rising edge and the falling edge of the input clock Clk. The multiplexer 260 passes the delayed rising edge from the second delay path 228 to the output 224, and passes the delayed falling edge from the first delay path 226 to the output 224. Thus, the present disclosure covers implementations where the multiplexer 260 selects the first input 262 when the logic value at the select input 266 is zero (e.g., low) and selects the second input 264 when the logic value at the select input 266 is one (e.g., high).

Figure 4:
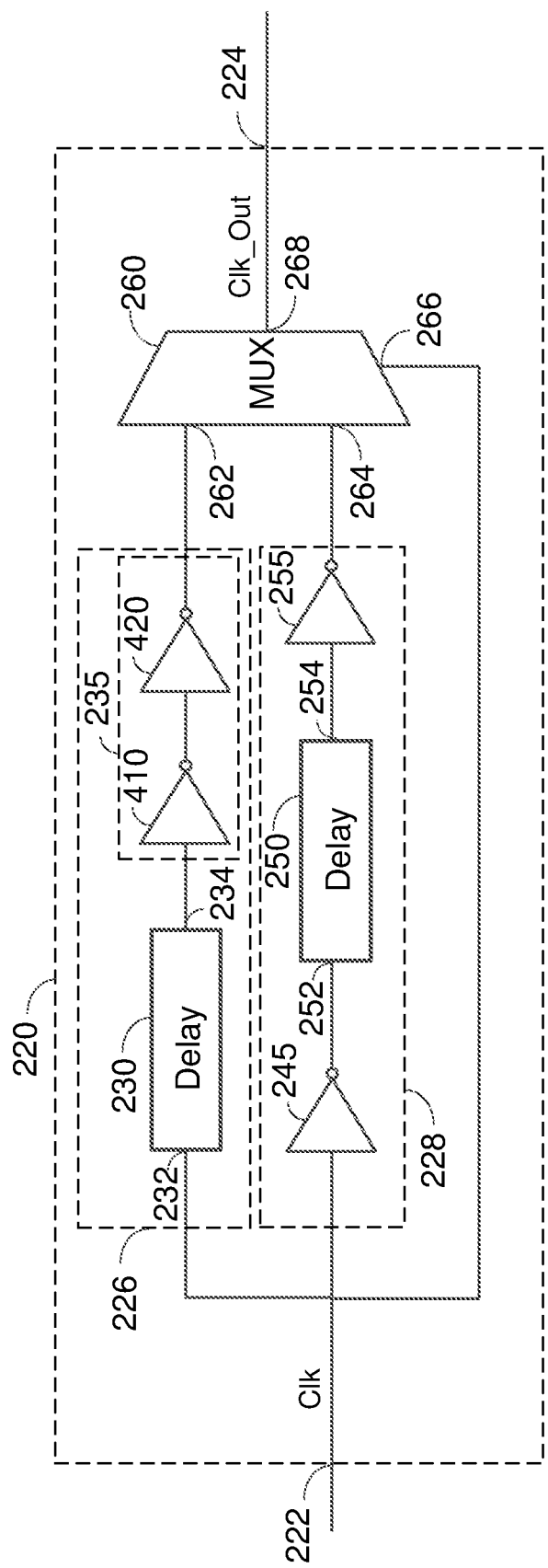
FIG. 4 shows an exemplary implementation of a delay buffer according to certain aspects of the present disclosure.

FIG. 4 shows an exemplary implementation of the delay buffer 235 according to certain aspects. In this example, the delay buffer 235 includes a third inverter 410 and a fourth inverter 420 coupled in series to approximately match the combined time delay of the first inverter 245 and the second inverter 255 in the second delay path 228. As discussed above, the delays of the first inverter 245, the second inverter 255, and the delay buffer 235 are not shown in FIG. 3.

For the example in which the delay circuit 220 implements the delay circuit 120 shown in FIG. 1A, the input 222 of the delay circuit 220 may be coupled to the clock output 118 of the clock generator 115, and the output 224 of the delay circuit 220 may be coupled to the clock input 132 of the first circuit 130. In this example, the delay circuit 220 may be used to delay the clock signal Clk to skew the clock signal Clk between the first circuit 130 and the second circuit 135, as discussed above.

Figure 5:
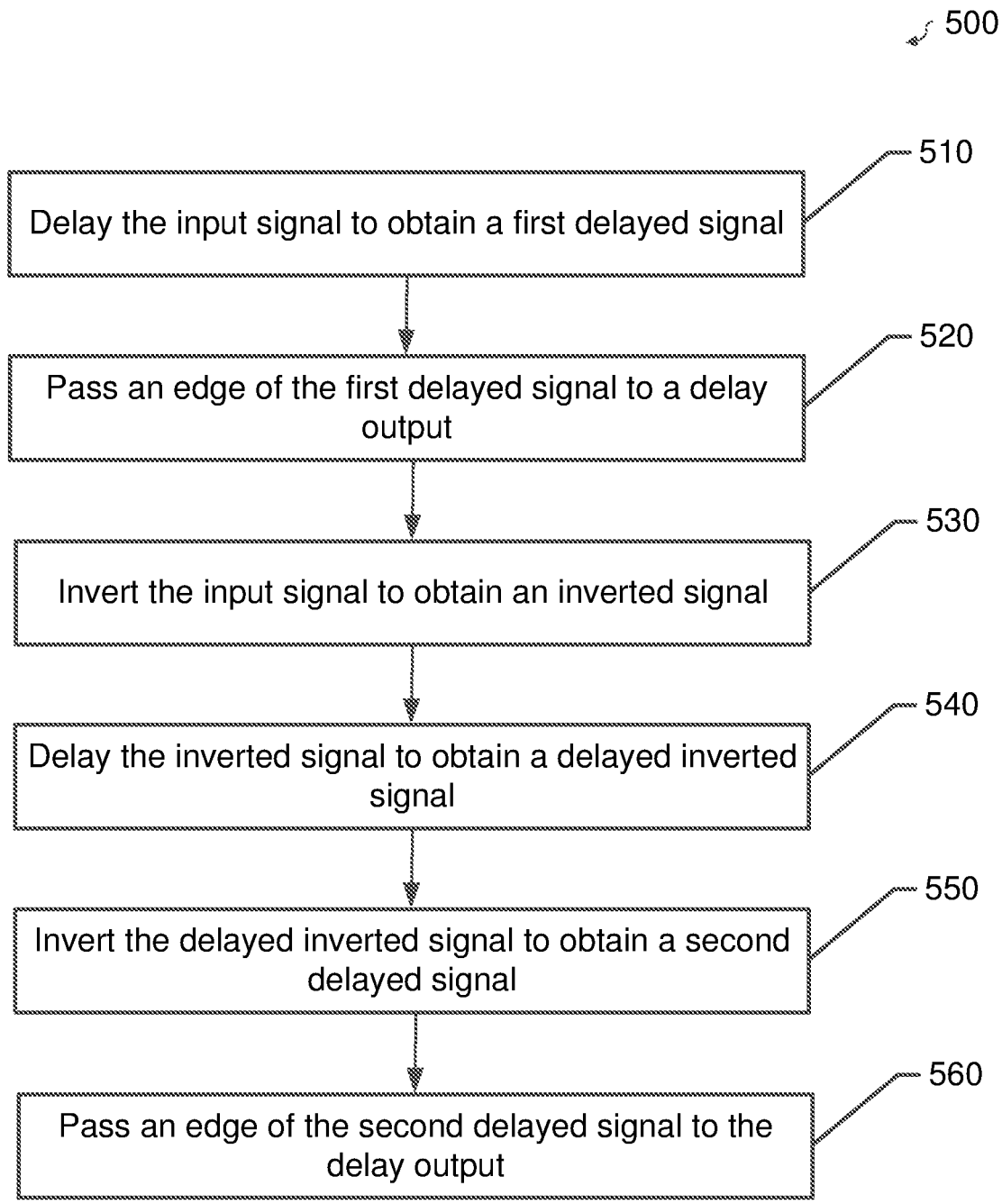
FIG. 5 is a flowchart illustrating an exemplary method for delaying a signal according to certain aspects of the present disclosure.

FIG. 5 illustrates a method 500 for delaying an input signal according to certain aspects of the present disclosure. The input signal may include a clock signal (e.g., the clock signal Clk) or another type of signal.

At block 510, the input signal is delayed to obtain a first delayed signal. For example, the input signal may be delayed by a first delay device (e.g., the first delay device 230). The input signal may additionally be delayed by a delay buffer (e.g., delay buffer 235). The first delayed signal may correspond to the first delayed signal Delay_1.

At block 520, an edge of the first delayed signal is passed to a delay output. For example, the edge of the first delayed signal may be a rising edge, and the delay output may correspond to the output 224. The edge of the first delayed signal may be passed to the delay output using a multiplexer (e.g., the multiplexer 260).

At block 530, the input signal is inverted to obtain an inverted signal. For example, the input signal may be inverted by a first inverter (e.g., the first inverter 245). The inverted signal may correspond to the inverted clock signal Clkb.

At block 540, the inverted signal is delayed to obtain a delayed inverted signal. For example, the inverted signal may be delayed by a second delay device (e.g., the second delay device 250). The delayed inverted signal may correspond to the delayed inverted clock signal Clkb_Del. The first delay device and the second delay device may have approximately the same time delay. In certain aspects, the first delay device and the second delay device have the same or substantially the same structure.

At block 550, the delayed inverted signal is inverted to obtain a second delayed signal. For example, the delayed inverted signal may be inverted by a second inverter (e.g., the second inverter 255). The second delayed signal may correspond to the second delayed signal Delay_2.

At block 560, an edge of the second delayed signal is passed to the delay output. For example, the edge of the second delayed signal may be a falling edge. The edge of the second delayed signal may be passed to the delay output using the multiplexer (e.g., the multiplexer 260).

In some implementations, the edge of the first delayed signal may be a falling edge and the edge of the second delayed signal may be a rising edge.

In some implementations, the first delayed signal is input to a first input (e.g., first input 262) of a multiplexer (e.g., multiplexer 260), the second delayed signal is input to a second input (e.g., second input 264) of the multiplexer, and an output (e.g., output 268) of the multiplexer is coupled to the delay output. In these implementations, passing the edge of the first delayed signal to the delay output comprises inputting a first logic value to a select input (e.g., select input 266) of the multiplexer, and passing the edge of the second delayed signal to the delay output comprises inputting a second logic value to the select input of the multiplexer. In one example, the first logic value is a logic one and the second logic value is a logic zero. In another example, the first logic value is a logic zero and the first logic value is a logic one.

Figure 6:
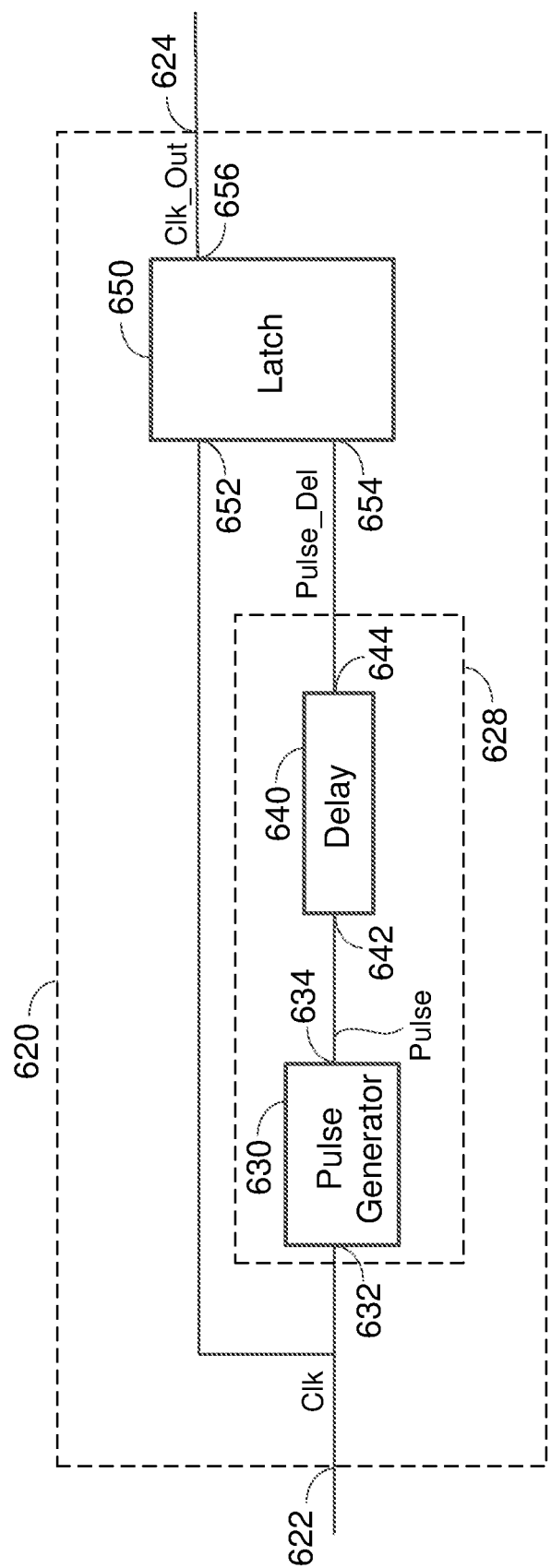
FIG. 6 shows another example of a delay circuit according to certain aspects of the present disclosure.

FIG. 6 shows another exemplary delay circuit 620 according to certain aspects of the present disclosure. The delay circuit 620 may be used to implement the delay circuit 120 shown in FIG. 1.

In this example, the delay circuit 620 includes a delay path 628, and a latch 650. The latch 650 includes a first input 652, a second input 654, and an output 656. The first input 652 of the latch 650 is coupled to the input 622 of the delay circuit 620, and the output 656 of the latch 650 is coupled to the output 624 of the delay circuit 620. The delay path 628 is coupled between the input 622 of the delay circuit 620 and the second input 654 of the latch 650. In one example, the latch is 652 is configured to latch a logic value at the first input 652 in response to a rising edge at the second input 654, and output the latched logic value at the output 656. The latch 650 may be implemented with a flip flop (e.g., D flip flop) or another type of latch.

The delay path 628 includes a pulse generator 630 and a delay device 640. The pulse generator 630 includes an input 632 coupled to the input 622 of the delay circuit 620, and an output 634. The delay device 640 is coupled between the output 634 of the pulse generator 630 and the second input 654 of the latch 650. In the example shown in FIG. 6, the input 642 of the delay device 640 is coupled to the output 634 of the pulse generator 630, and the output 644 of the delay device 640 is coupled to the second input 654 of the latch 650. The delay device 640 may be implemented with a resistor-capacitor (RC) delay device or another type of delay device.

The pulse generator 630 is configured to generate a pulse in response to each edge of the input signal (e.g., the signal input to the input 622 of the delay circuit 620). In one example, the input signal is a clock signal (e.g., the clock signal Clk). In this example, during each cycle (e.g., period) of the clock signal, the pulse generator 630 may be configured to generate a first pulse in response to the rising edge of the clock signal in the cycle, and generate a second pulse in response to the falling edge of the clock signal in the cycle. The pulse generator 630 outputs the first and second pulses at the output 634 of the pulse generator 630, which is coupled to the delay device 640.

The delay device 640 is configured to delay each pulse from the pulse generator 630 by a time delay to obtain a delayed pulse, and output the delayed pulse to the second input 654 of the latch 650. In one example, for each delayed pulse received at the second input 654 of the latch 650, the latch 650 is configured to latch a logic value of the input signal at the first input 652 of the latch 650 on the rising edge of the delayed pulse, and output the latched logic value at the output 656 of the latch 650.

Exemplary operations of the delay circuit 620 will now be described with reference to FIG. 7, which shows a timing diagram illustrating exemplary signals in the delay circuit 620 according to certain aspects. In the example illustrated in FIG. 7, the delay circuit 620 is used to delay the clock signal Clk, although it is to be appreciated that the delay circuit 620 is not limited to delaying a clock signal. In the example in FIG. 7, the latch 650 latches the logic value (e.g., logic state) of the clock signal Clk in response to each rising edge at the second input 654 of the latch 650. The output 656 of the latch 650 provides the delayed output clock signal Clk_Out of the delay circuit 620.

Figure 7:
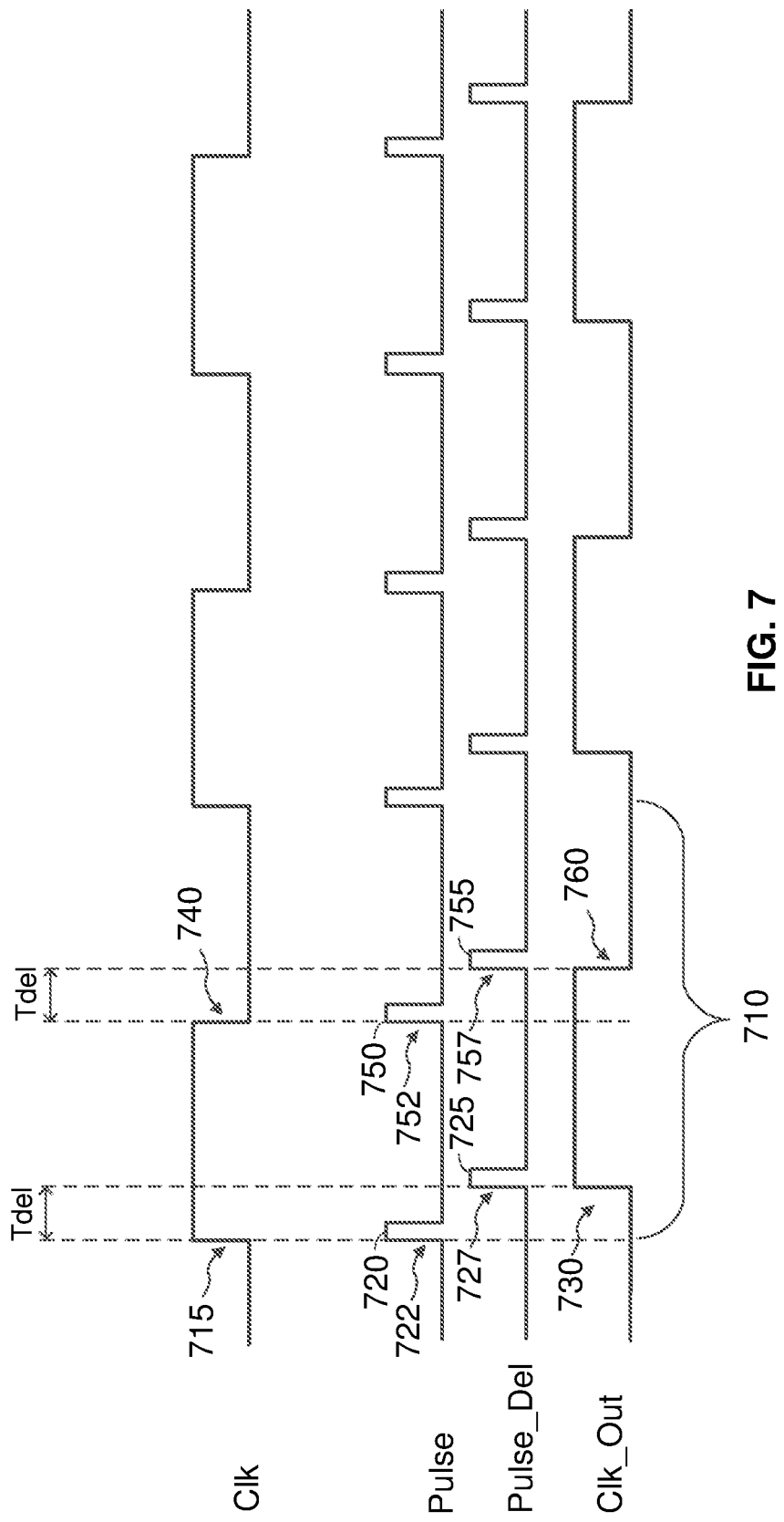
FIG. 7 is a timing diagram showing an example of signals in the delay circuit of FIG. 6 according to certain aspects of the present disclosure.

In the exemplary timing diagram shown in FIG. 7, the time delays associated with the pulse generator 630 and the latch 650 are assumed to be negligible compared with the time delay of the delay device 640, and are therefore not shown in FIG. 7. However, it is to be appreciated that this need not be the case.

In FIG. 7, the clock signal Clk is input to the first input 652 of the latch 650 and the input 632 of the pulse generator 630. During a cycle 710 of the clock signal Clk, the pulse generator 630 generates a first pulse 720 in response to the rising edge 715 of the clock signal Clk in the cycle 710. The rising edge 722 of the first pulse 720 is approximately aligned with the rising edge 715 of the clock signal Clk. The delay device 640 delays the first pulse 720 by a time delay Tdel to obtain a first delayed pulse 725, and outputs the first delayed pulse 725 to the second input 654 of the latch 650. The latch 650 latches the logic value of the clock signal Clk on the rising edge 727 of the first delayed pulse 725, and outputs the latched value at the output 624 of the delay circuit 620. In this example, the latched logic value of the clock signal Clk is one (e.g., high), which generates a rising edge 730 of the output clock signal Clk_Out at the output 624. The delay between the rising edge 730 of the output clock signal Clk_Out and the rising edge 715 of the input clock signal Clk is approximately Tdel.

During the cycle 710, the pulse generator 630 also generates a second pulse 750 in response to the falling edge 740 of the clock signal Clk in the cycle 710. The rising edge 752 of the second pulse 750 is approximately aligned with the falling edge 740 of the clock signal Clk. The delay device 640 delays the second pulse 750 by the time delay Tdel to obtain a second delayed pulse 755, and outputs the second delayed pulse 755 to the second input 654 of the latch 650. The latch 650 latches the logic value of the clock signal Clk on the rising edge 757 of the second delayed pulse 755, and outputs the latched value at the output 624 of the delay circuit 620. In this example, the latched logic value of the clock signal Clk is zero (e.g., low), which generates a falling edge 760 of the output clock signal Clk_Out at the output 624. The delay between the falling edge 760 of the output clock signal Clk_Out and the falling edge 740 of the input clock signal Clk is approximately Tdel.

The delay circuit 620 is able to accurately maintain the duty cycle of the input clock signal Clk even when the delay device 640 has different delays for rising and falling edges. This is because the latch 650 latches the logic value of zero of the input clock signal Clk on the rising edge 757 of the second delayed pulse 755 to generate the falling edge 760 of the output clock signal Clk_Out. As a result, the delay between the falling edge 760 of the output clock signal Clk_Out and the falling edge 740 of the input clock signal Clk depends on the delay of the rising edge 752 of the second pulse 750 by the delay device 640. The delay of the rising edge 752 of the second pulse 750 is approximately the same as the delay of the rising edge 722 of the first pulse 720 by the delay device 640.

The delay circuit 620 may perform the exemplary operations discussed above for each cycle of the input clock signal Clk.

The exemplary delay circuit 620 shown in FIG. 6 uses the same delay device 640 to delay the rising edge of the first pulse 720 and the rising edge of the second pulse 750. Using the same delay device 640 helps ensure that the delay of the rising edge of the first pulse 720 and the delay of the rising edge of the second pulse 750 are approximately the same without the need of having to closely match the delays of two separate delay devices. Since the rising edge of the first pulse 720 is used to delay the rising edge 715 of the input clock signal Clk and the rising edge of the second pulse 750 is used to delay the falling edge 740 of the input clock signal Clk, making the delay of the rising edge of the first pulse 720 and the delay of the rising edge of the second pulse 750 approximately the same helps ensure that the delay of the rising edge 730 of the input clock signal Clk and the delay of the falling edge 740 of the input clock signal Clk are approximately the same.

Figure 8:
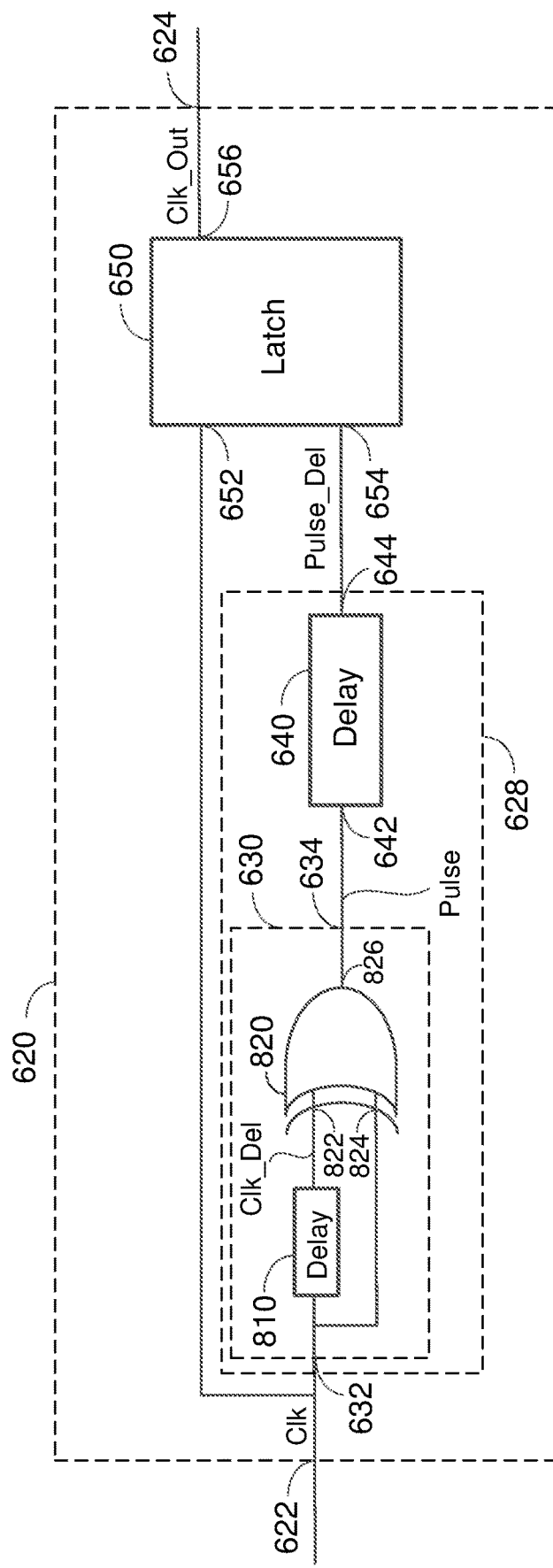
FIG. 8 shows an exemplary implementation of a pulse generator according to certain aspects of the present disclosure.

FIG. 8 shows an exemplary implementation of the pulse generator 630 according to certain aspects of the present disclosure. In this example, the pulse generator 630 includes a second delay device 810, and an exclusive OR (XOR) gate 820. The XOR gate 820 includes a first input 822, a second input 824, and an output 826. The second delay device 810 is coupled between the input 632 of the pulse generator 630 and the first input 822 of the XOR gate 820. The second input 824 of the XOR gate 820 is coupled to the input 632 of the pulse generator 630, and the output 826 of the XOR gate 820 is coupled to the output 634 of the pulse generator 630.

The second delay device 810 is configured to delay the input signal of the delay circuit 620 by a time delay of td. The XOR gate 820 is configured to output a logic value of one (e.g., high) at the output 826 when the logic value at the first input 822 is different from the logic value at the second input 824. The XOR gate 820 is configured to output a logic value of zero (e.g., low) at the output 826 when the logic value at the first input 822 is the same as the logic value at the second input 824.

Figure 9:
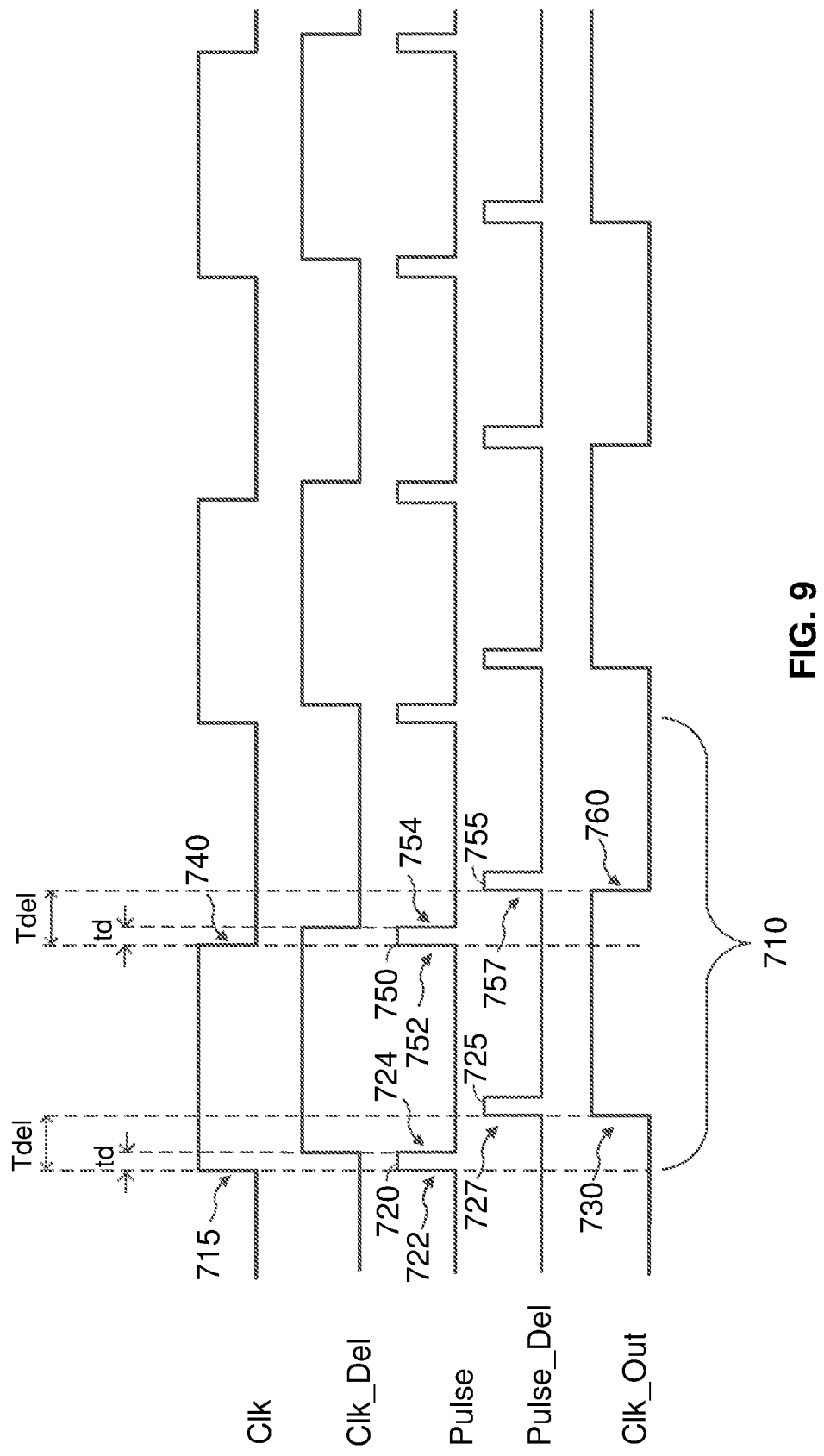
FIG. 9 is a timing diagram showing an example of signals in the pulse generator according to certain aspects of the present disclosure.

Exemplary operations of the pulse generator 630 will now by discussed with reference to FIG. 9, which shows a timing diagram illustrating exemplary signals in the delay circuit 620 according to certain aspects. In the example illustrated in FIG. 9, the delay circuit 620 is used to delay the clock signal Clk, although it is to be appreciated that the delay circuit 620 is not limited to delaying a clock signal. In the example in FIG. 9, the second delay device 810 delays the input clock signal Clk by the time delay of td to obtain a delayed clock signal Clk_Del. In the exemplary timing diagram shown in FIG. 9, the time delay of the XOR gate 820 is assumed to be negligible compared with the delay of the second delay device 810, and is therefore not shown in FIG. 9.

During a cycle 710 of the clock signal Clk, the pulse generator 630 receives a rising edge 715 of the clock signal Clk at the input 632 of the pulse generator 630. The rising edge 715 of the clock signal Clk causes the logic value at the output of the XOR gate 820 to go from low to high, which generates the rising edge 722 of the first pulse 720. This is because the logic value of the delayed clock signal Clk_Del at the first input 822 and the logic value of the clock signal Clk at the second input 824 of the XOR gate 820 become different when the rising edge 715 of the clock signal Clk first arrives due to the delay of the second delay device 810. After the delay of td of the second delay device 810, the logic value of the delayed clock signal Clk_Del at the first input 822 becomes the same as the logic value of the clock signal Clk at the second input 824 of the XOR gate 820, which causes the XOR gate 820 to go from high to low and generate the falling edge 724 of the first pulse 720. As a result, the duration of the first pulse 720 is approximately equal to the time that the logic value of the delayed clock signal Clk_Del at the first input 822 and the logic value of the clock signal Clk at the second input 824 of the XOR gate 820 are different, which is approximately equal to the delay td of the second delay device 810. Thus, the duration (i.e., the width) of the first pulse 720 is approximately equal to the time delay td. In the example in FIG. 9, the rising edge 722 of the first pulse 720 is approximately aligned with the rising edge 715 of the clock signal Clk, assuming the delay of the XOR gate 820 is negligible.

During the cycle 710 of the clock signal Clk, the pulse generator 630 receives a falling edge 740 of the clock signal Clk. The falling edge 740 of the clock signal Clk causes the logic value at the output of the XOR gate 820 to go from low to high, which generates the rising edge 752 of the second pulse 750. This is because the logic value of the delayed clock signal Clk_Del at the first input 822 and the logic value of the clock signal Clk at the second input 824 of the XOR gate 820 become different when the falling edge 740 of the clock signal Clk first arrives due to the delay of the second delay device 810. After the delay of td of the second delay device 810, the logic value of the delayed clock signal Clk_Del at the first input 822 becomes the same as the logic value of the clock signal Clk at second input 824 of the XOR gate 820, which causes the XOR gate 820 to go from high to low and generate the falling edge 754 of the second pulse 750. As a result, the duration (i.e., the width) of the second pulse 750 is approximately equal to the delay td of the second delay device 810. In the example in FIG. 9, the rising edge 752 of the second pulse 750 is approximately aligned with the falling edge 740 of the clock signal Clk, assuming the delay of the XOR gate 820 is negligible.

Note that, in the above example, the time delay td of the second delay device 810 sets the width of the first pulse 720 and the width of the second pulse 750. The delay between the output clock signal Clk_Out and the input clock signal Clk is set by the delay Tdel of the delay device 640.

Figure 10:
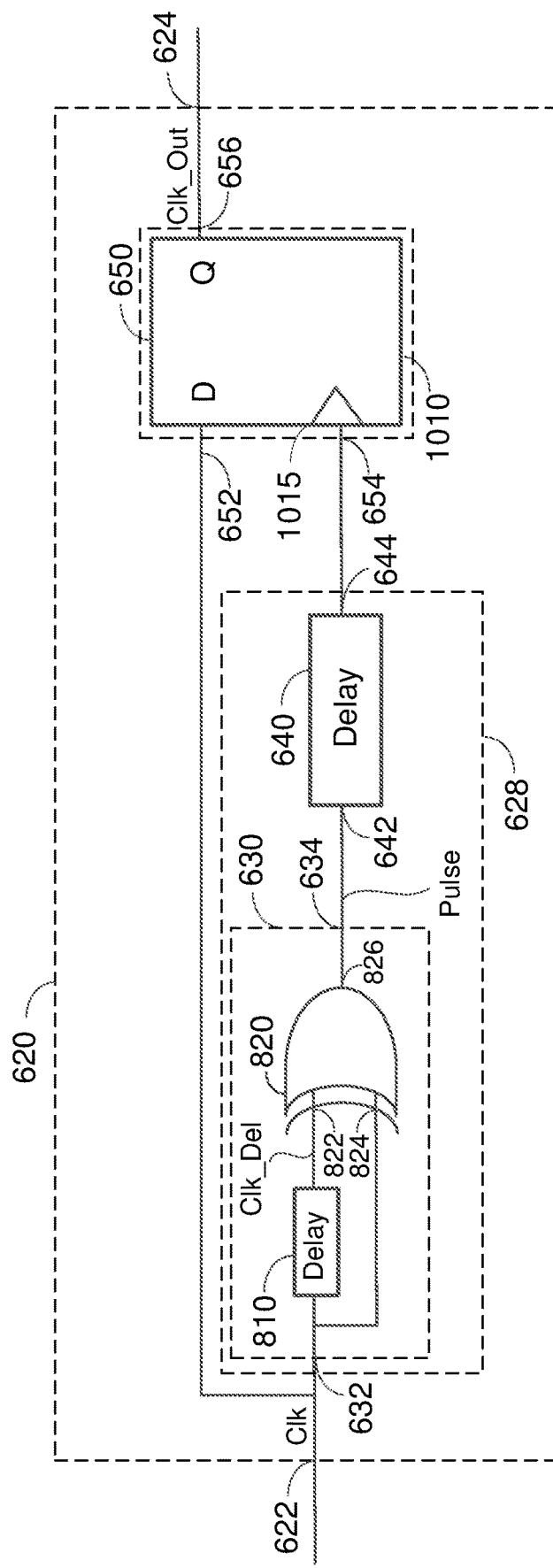
FIG. 10 shows an example of a latch implemented with a flip flop according to certain aspects of the present disclosure.

FIG. 10 shows an example in which the latch 650 is implemented with a flip flop 1010 (e.g., D flip flip). In this example, the first input 652 corresponds to a data input (labeled "D") of the flip flop 1010, the second input 654 corresponds to the clock input 1015 of the flip flop 1010, and the output 656 corresponds to the output (labeled "Q") of the flip flop 1010. The delayed pulses of the pulse generator 630 are input to the clock input 1015 of the flip flop 1010. As a result, the flip flop 1010 is clocked by the delayed pulses of the pulse generator 630.

In this example, the flip flop 1010 is a positive-edge triggered flip flop configured to latch logic values of the clock signal Clk at the data input D of the flip flop 1010 on rising edges (i.e., positive edges) of the delayed pulses, and output the latched logic values at the output Q of the flip flop 1010. In this example, the input clock signal Clk is delayed by approximately Tdel by delaying the pulses of the pulse generator 630 used to clock the flip flop 1010 by approximately Tdel. It is to be appreciated that the latch 650 is not limited to a flip flop, and may be implemented with a different type of latch.

It is to be appreciated that the present disclosure is not limited to the exemplary implementation discussed above in which the pulse generator 630 generates positive pulses and the latch 650 is triggered by rising edges (i.e., positive edges). For example, in some implementations, the pulse generator 630 may be configured generate a negative pulse in response to each edge of the clock signal Clk. In this example, the delay device 640 delays the negative pulses generated by the pulse generator 630 to obtain the delayed pulses, which are input to the second input 654 of the latch 650. For each delayed pulse received at the second input 654, the latch 650 is configured to latch a logic value of the input signal at the first input 652 of the latch 650 on the falling edge of the delayed pulse. In this example, the waveforms for the pulses and the delayed pulses shown in FIG. 7 may be inverted. In this example, the latch 650 may be implemented with a negative-edge triggered flip flop, and the XOR gate 820 in the example in FIG. 8 may be replaced with an exclusive NOR gate.

Figure 11:
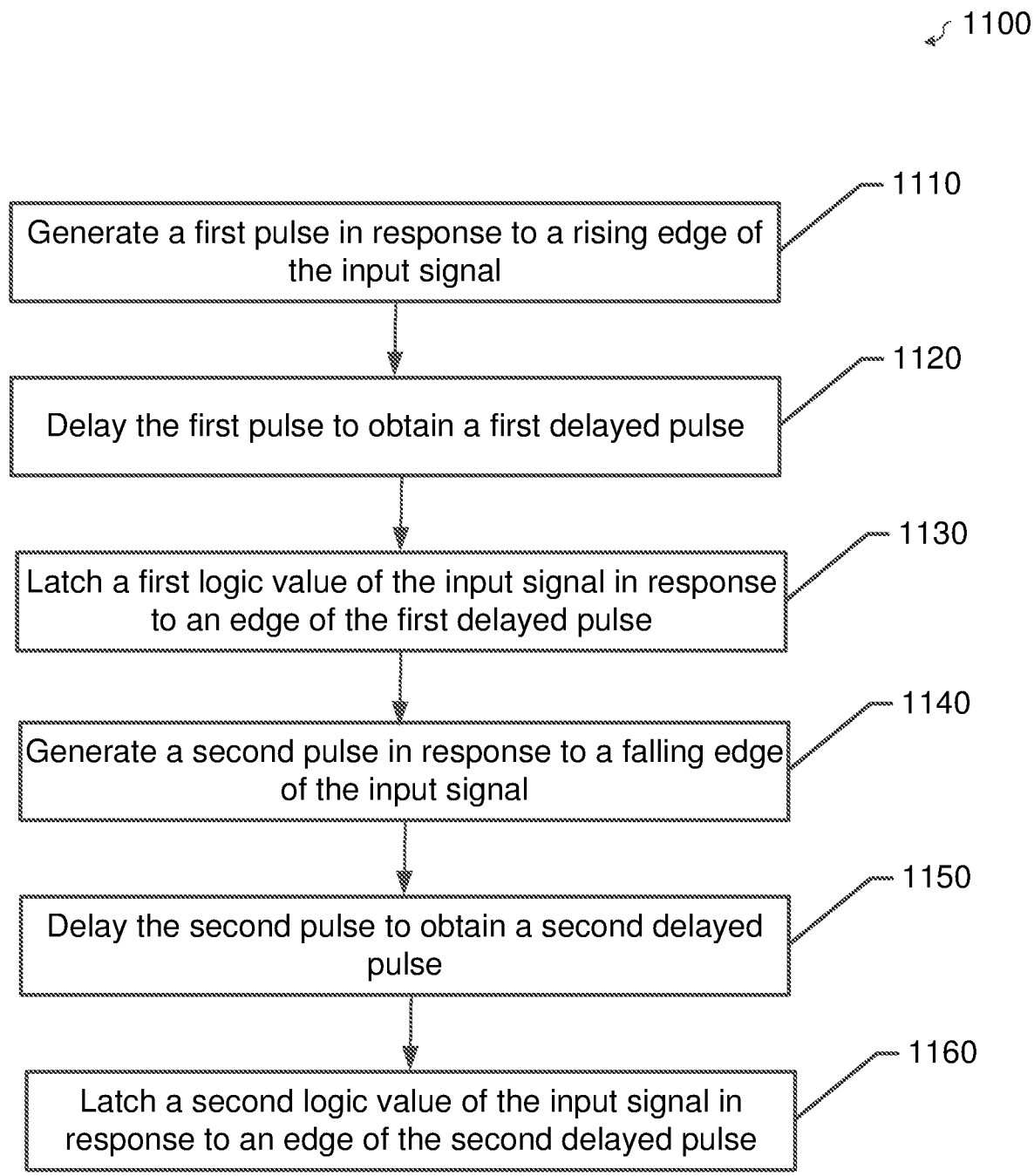
FIG. 11 is a flowchart illustrating another exemplary method for delaying a signal according to certain aspects of the present disclosure.

FIG. 11 illustrates a method 1100 for delaying an input signal according to certain aspects of the present disclosure. The input signal may include a clock signal (e.g., the clock signal Clk) or another type of signal.

At block 1110, a first pulse is generated in response to a rising edge of the input signal. For example, the first pulse (e.g., first pulse 720) may be generated by a pulse generator (e.g., pulse generator 630). The input signal may be a clock signal (e.g., the clock signal Clk).

At block 1120, the first pulse is delayed to obtain a first delayed pulse. For example, the first pulse may be delayed by a delay device (e.g., delay device 640) to obtain the first delayed pulse (e.g., first delayed pulse 725).

At block 1130, a first logic value of the input signal is latched in response to an edge of the first delayed pulse. For example, the first logic value (e.g., logic one) of the input signal may be latched with a latch (e.g., latch 650), and the edge of the first delayed pulse may be a rising edge.

At block 1140, a second pulse is generated in response to a falling edge of the input signal. For example, the second pulse (e.g., second pulse 750) may be generated by the pulse generator (e.g., pulse generator 630).

At block 1150, the second pulse is delayed to obtain a second delayed pulse. For example, the second pulse may be delayed by the delay device (e.g., delay device 640) to obtain the second delayed pulse (e.g., second delayed pulse 755).

At block 1160, a second logic value of the input signal is latched in response to an edge of the second delayed pulse. For example, the second logic value (e.g., logic zero) of the input signal may be latched with the latch (e.g., latch 650), and the edge of the second delayed pulse may be a rising edge.

The latched first logic value and the latched second logic value may be output at the output 624 of the delay circuit 620.

In some implementations, the edge of the first delayed pulse and the edge of the second delayed pulse may each be a falling edge.

In one example, the first logic value is a logic one and the second logic value is a logic zero. In another example, the first logic value is a logic zero and the second logic value is a logic one.

Any reference to an element herein using a designation such as "first," "second," and so forth does not generally limit the quantity or order of those elements. Rather, these designations are used herein as a convenient way of distinguishing between two or more elements or instances of an element. Thus, a reference to first and second elements does not mean that only two elements can be employed, or that the first element must precede the second element.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect electrical coupling between two structures. As used herein, the term "approximately" means within 10 percent of the stated value (e.g., between 90 percent and 110 percent of the stated value). The time delays of two delay devices (e.g., the first delay device 230 and the second delay device 250) are "approximately" the same when the time delay of one of the delay devices is between 90 percent and 110 percent of the time delay of the other one of the delay devices.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A chip, comprising:
    a delay circuit, wherein the delay circuit comprises:
        a multiplexer including a first input, a second input, and an output;
        a first delay path coupled between an input of the delay circuit and the first input of the multiplexer, the first delay path including a first delay device;
        a second delay path coupled between the input of the delay circuit and the second input of the multiplexer, the second delay path including:
            a first inverter;
            a second delay device; and
            a second inverter.

2. The chip of claim 1, wherein the multiplexer includes a select input coupled to the input of the delay circuit.

3. The chip of claim 2, wherein the multiplexer is configured to selectively couple the first input or the second input to the output of the multiplexer based on a logic value input to the select input.

4. The chip of claim 3, wherein the multiplexer is configured to couple the first input to the output of the multiplexer when the logic value is one, and couple the second input to the output of the multiplexer when the logic value is zero.

5. The chip of claim 3, wherein the multiplexer is configured to couple the first input to the output of the multiplexer when the logic value is zero, and couple the second input to the output of the multiplexer when the logic value is one.

6. The chip of claim 1, wherein the first inverter is coupled between the input of the delay circuit and an input of the second delay device, and the second inverter is coupled between an output of the second delay device and the second input of the multiplexer.

7. The chip of claim 1, wherein the first delay device has a time delay approximately equal to a time delay of the second delay device.

8. The chip of claim 1, wherein the first delay path further includes a delay buffer.

9. The chip of claim 8, wherein the delay buffer has a time delay approximately equal to a combined time delay of the first inverter and the second inverter.

10. The chip of claim 1, further comprising:
    a clock generator coupled to the input of the delay circuit; and
    a switching amplifier coupled to the output of the multiplexer.

11. The chip of claim 1, further comprising:
    a clock generator coupled to the input of the delay circuit; and
    a switching regulator coupled to the output of the multiplexer.

12. A method for delaying an input signal, comprising:
    delaying the input signal to obtain a first delayed signal;
    passing an edge of the first delayed signal to a delay output;
    inverting the input signal to obtain an inverted signal;
    delaying the inverted signal to obtain a delayed inverted signal;
    inverting the delayed inverted signal to obtain a second delayed signal; and passing an edge of the second delayed signal to the delay output.

13. The method of claim 12, wherein the edge of the first delayed signal is a rising edge, and the edge of the second delayed signal is a falling edge.

14. The method of claim 12, wherein the edge of the first delayed signal is a falling edge, and the edge of the second delayed signal is a rising edge.

15. The method of claim 12, wherein:
the first delayed signal is input to a first input of a multiplexer;
the second delayed signal is input to a second input of the multiplexer;
an output of the multiplexer is coupled to the delay output;
passing the edge of the first delayed signal to the delay output comprises inputting a first logic value to a select input of the multiplexer; and
passing the edge of the second delayed signal to the delay output comprises inputting a second logic value to the select input of the multiplexer.

16. The method of claim 15, wherein:
the input signal comprises a clock signal; and
inputting the first logic value to the select input of the multiplexer and inputting the second logic value to the select input of the multiplexer comprises inputting the clock signal to the select input of the multiplexer.

17. A chip, comprising:
a delay circuit, wherein the delay circuit comprises:
a latch including a first input, a second input, and an output, wherein the first input is coupled to an input of the delay circuit; and
a delay path coupled between the input of the delay circuit and the second input of the latch, wherein the delay path includes:
a pulse generator including an input and an output, wherein the input of the pulse generator is coupled to the input of the delay circuit, and the pulse generator is configured to:
generate a first pulse in response to a rising edge at the input of the pulse generator; and
generate a second pulse in response to a falling edge at the input of the pulse generator; and
a delay device coupled between the output of the pulse generator and the second input of the latch.

18. The chip of claim 17, wherein the latch comprises a flip flop, the first input comprises a data input of the flip flop, and the second input comprises a clock input of the flip flop.

19. The chip of claim 18, wherein the flip flop is a positive-edge triggered flip flop.

20. The chip of claim 18, wherein the flip flop is a negative-edge triggered flip flop.

21. The chip of claim 17, wherein:
the delay device is configured to delay the first pulse into a first delayed pulse and delay the second pulse into a second delayed pulse; and
the latch is configured to:
latch a first logic value at the first input of the latch in response to the first delayed pulse at the second input of the latch;
output the latched first logic value at the output of the latch;
latch a second logic value at the first input of the latch in response to the second delayed pulse at the second input of the latch; and
output the latched second logic value at the output of the latch.

22. The chip of claim 21, wherein the latch is configured to latch the first logic value in response to a rising edge of the first delayed pulse at the second input of the latch, and latch the second logic value in response to a rising edge of the second delayed pulse at the second input of the latch.

23. The chip of claim 21, wherein the latch is configured to latch the first logic value in response to a falling edge of the first delayed pulse at the second input of the latch, and latch the second logic value in response to a falling edge of the second delayed pulse at the second input of the latch.

24. The chip of claim 17, wherein the pulse generator comprises:
an exclusive OR gate including a first input, a second input, and an output, wherein the second input of the exclusive OR gate is coupled to the input of the pulse generator, and the output of the exclusive OR gate is coupled to the output of the pulse generator; and
a second delay device coupled between the input of the pulse generator and the first input of the exclusive OR gate.

25. The chip of claim 17, further comprising:
a clock generator coupled to the input of the delay circuit; and
a switching amplifier coupled to the output of the latch.

26. The chip of claim 17, further comprising:
a clock generator coupled to the input of the delay circuit; and
a switching regulator coupled to the output of the latch.

27. A method for delaying an input signal, comprising:
generating a first pulse in response to a rising edge of the input signal;
delaying the first pulse to obtain a first delayed pulse;
latching a first logic value of the input signal in response to an edge of the first delayed pulse;
generating a second pulse in response to a falling edge of the input signal;
delaying the second pulse to obtain a second delayed pulse; and
latching a second logic value of the input signal in response to an edge of the second delayed pulse.

28. The method of claim 27, wherein the edge of the first delayed pulse and the edge of the second delayed pulse are rising edges.

29. The method of claim 27, wherein the edge of the first delayed pulse and the edge of the second delayed pulse are falling edges.

30. The method of claim 27, wherein the input signal comprises a clock signal.

* * * * *